United States Patent
Moon et al.

(10) Patent No.: US 12,471,216 B2
(45) Date of Patent: Nov. 11, 2025

(54) ELECTRONIC DEVICE

(71) Applicant: SAMSUNG ELECTRONICS CO., LTD., Suwon-si (KR)

(72) Inventors: Yohan Moon, Suwon-si (KR); Hyoseok Na, Suwon-si (KR); Taeyang Na, Suwon-si (KR); Jonghun Yoo, Suwon-si (KR); Seonjun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 117 days.

(21) Appl. No.: 18/224,929

(22) Filed: Jul. 21, 2023

(65) Prior Publication Data

US 2023/0371180 A1  Nov. 16, 2023

Related U.S. Application Data

(63) Continuation of application No. PCT/KR2022/001140, filed on Jan. 21, 2022.

(30) Foreign Application Priority Data

Jan. 22, 2021 (KR) .................. 10-2021-0009621

(51) Int. Cl.
*H05K 1/14* (2006.01)
*H05K 1/18* (2006.01)
*H05K 3/34* (2006.01)

(52) U.S. Cl.
CPC ............. *H05K 1/144* (2013.01); *H05K 1/145* (2013.01); *H05K 1/181* (2013.01); *H05K 3/3457* (2013.01);
(Continued)

(58) Field of Classification Search
CPC .... H05K 1/14; H05K 1/141–147; H05K 1/18; H05K 1/181–187;
(Continued)

(56) References Cited

U.S. PATENT DOCUMENTS 6,552,423 B2 * 4/2003 Song .................. H01L 25/0657
257/679
7,687,899 B1 3/2010 Berry
(Continued)

FOREIGN PATENT DOCUMENTS

JP     2007-67442 A     3/2007
KP     10-2009-0108393 A     10/2009
(Continued)

OTHER PUBLICATIONS

International Search Report (PCT/ISA/210) issued May 9, 2022 by the International Searching Authority in International Patent Application No. PCT/KR2022/001140.
(Continued)

*Primary Examiner* — Tuan T Dinh
(74) *Attorney, Agent, or Firm* — Sughrue Mion, PLLC

(57) ABSTRACT

An electronic device includes: a first circuit board; at least one electronic component module disposed on the first circuit board; one first connection member disposed on the first circuit board; and a second circuit board stacked on the one first connection member, wherein the one electronic component module includes: a third circuit board facing the first circuit board; one first electronic component disposed on the third circuit board; a fourth circuit board facing the second circuit board; one second electronic component disposed on the fourth circuit board; a first contact point disposed on the third circuit board and configured to electrically connect the first circuit board with the third circuit board; and a second contact point disposed on the fourth
(Continued)

circuit board and configured to electrically connect the second circuit board with the fourth circuit board.

19 Claims, 12 Drawing Sheets

(52) U.S. Cl.
CPC ............... *H05K 2201/10098* (2013.01); *H05K 2201/10378* (2013.01); *H05K 2203/0415* (2013.01)

(58) Field of Classification Search
CPC .......... H05K 2201/10098; H05K 2201/10378; H01L 23/498; H01L 23/49816; H01L 23/5385; H01L 23/552
USPC ................ 361/760, 764, 770–787, 790–795; 257/660–690
See application file for complete search history.

(56) References Cited

U.S. PATENT DOCUMENTS

| | | | | |
|---|---|---|---|---|
| 7,838,337 | B2* | 11/2010 | Marimuthu | H01L 21/6835 257/E21.511 |
| 7,901,987 | B2* | 3/2011 | Yang | H01L 25/105 257/737 |
| 8,106,499 | B2* | 1/2012 | Camacho | H01L 23/5389 438/109 |
| 8,466,544 | B2* | 6/2013 | Pagaila | H01L 21/6835 257/E21.511 |
| 8,816,404 | B2* | 8/2014 | Kim | H01L 21/561 257/104 |
| 2004/0070083 | A1* | 4/2004 | Su | H01L 25/0657 257/E25.023 |
| 2004/0145044 | A1* | 7/2004 | Sugaya | H01L 21/56 257/E23.178 |
| 2006/0055017 | A1 | 3/2006 | Cho et al. | |
| 2009/0236753 | A1 | 9/2009 | Moon et al. | |
| 2010/0087035 | A1 | 4/2010 | Yoo et al. | |
| 2010/0149768 | A1* | 6/2010 | Takaike | H05K 1/186 29/830 |
| 2011/0096506 | A1* | 4/2011 | Huang | H01L 25/0657 361/729 |
| 2013/0069239 | A1 | 3/2013 | Kim et al. | |
| 2016/0276325 | A1 | 9/2016 | Nair et al. | |
| 2017/0141087 | A1 | 5/2017 | Vincent et al. | |
| 2017/0288724 | A1* | 10/2017 | Kamgaing | H04B 1/48 |
| 2018/0332709 | A1* | 11/2018 | Otsubo | H01F 17/04 |
| 2019/0088621 | A1 | 3/2019 | Yang et al. | |
| 2020/0091608 | A1 | 3/2020 | Alpman et al. | |
| 2022/0158361 | A1 | 5/2022 | Kim et al. | |

FOREIGN PATENT DOCUMENTS

| | | |
|---|---|---|
| KR | 10-2009-0101116 A | 9/2009 |
| KR | 10-2016-0046758 A | 4/2016 |
| KR | 10-2017-0096223 A | 8/2017 |
| KR | 10-2019-0031157 A | 3/2019 |
| KR | 10-2019-0089955 A | 7/2019 |
| KR | 10-2019-0099728 A | 8/2019 |
| KR | 10-2019-0099738 A | 8/2019 |
| KR | 10-2020-0055982 A | 5/2020 |
| KR | 10-2020-0082417 A | 7/2020 |

OTHER PUBLICATIONS

Written Opinion (PCT/ISA/237) issued May 9, 2022 by the International Searching Authority in International Patent Application No. PCT/KR2022/001140.

Communication issued Jun. 10, 2025 by the Korean Intellectual Property Office in Korean Patent Application No. 10-2021-0009621.

* cited by examiner

ELECTRONIC DEVICE

CROSS-REFERENCE TO RELATED APPLICATIONS

This application is a by-pass continuation application of International Application No. PCT/KR2022/001140, filed on Jan. 21, 2022, which is based on and claims priority to Korean Patent Application No. 10-2021-0009621, filed on Jan. 22, 2021, in the Korean Intellectual Property Office, the disclosures of which are incorporated by reference herein their entireties.

BACKGROUND

1. Field

The disclosure relates to an electronic component module (such as a double-sided disposing-type electronic component module) and an electronic device including the same.

2. Description of Related Art

Various electronic devices such as a portable phone, an MP3 player, a portable multimedia player (PMP), a tablet PC, Galaxy Tab, a smartphone, iPad, or an e-book reader are provided to users, and the users may enjoy various types of content, while carrying such various electronic devices. Along with the design trend toward convenience, sophisticated designs, and decreased thicknesses, the electronic devices support multiple types of wireless mobile communication services in multiple frequency bands. A board with various electronic components disposed thereon and a connector provided for data compatibility such as a communication port may be provided inside an electronic device.

The electronic device may accommodate electronic components in a limited space to implement various functions. To effectively utilize an insufficient arrangement space, a stacked board structure is widely used, in which two or more boards are stacked. A connector is also widely used as a medium connecting the boards to each other.

Various components (e.g., an application processor, a communication processor, or a connector) arranged in an electronic device may be disposed on a printed circuit board through surface disposed device (SMD) processing. To effectively utilize an insufficient arrangement space in arranging various components in the electronic device, a stacked board structure (hereinafter, referred to as a 'stacked PCB structure') with two or more boards stacked therein may be used. Further, an interposer connector which provides electrical connectivity and/or mechanical flexibility between a semiconductor chip and a circuit board may be used for electrical connection of the stacked board structure.

However, although the use of the interposer connector in the stacked PCB structure may increase the arrangement efficiency of the electronic device, signals are transmitted between two boards (e.g., a master printed circuit board (PCB) and a slave PCB) only through the interposer connector. This limited signal transmission path may in turn limit the improvement of arrangement in the electronic device.

SUMMARY

Provided is a double-sided disposing-type electronic component module in which a signal transmission path is additionally secured in a stacked PCB structure using an interposer connector.

In addition, provided is a double-sided disposing-type electronic component module for increasing the mounting efficiency of an electronic device.

According to an aspect of the disclosure, an electronic device includes: a first circuit board; at least one electronic component module disposed on the first circuit board; at least one first connection member disposed on the first circuit board; and a second circuit board stacked on the at least one first connection member, wherein the at least one electronic component module includes: a third circuit board facing the first circuit board; at least one first electronic component disposed on the third circuit board; a fourth circuit board facing the second circuit board; at least one second electronic component disposed on the fourth circuit board; a first contact point disposed on the third circuit board and configured to electrically connect the first circuit board with the third circuit board; and a second contact point disposed on the fourth circuit board and configured to electrically connect the second circuit board with the fourth circuit board.

The at least one electronic component module may be a double-sided disposing-type electronic component module.

The first connection member may be an interposer connector.

The electronic device may further include a second connection member configured to connect the third circuit board with the fourth circuit board.

The second connection member may be a CU pillar or solder bumps.

The electronic device may further include a molding portion formed between the third circuit board and the fourth circuit board.

The electronic device may further include a fifth circuit board interposed between the third circuit board and the fourth circuit board.

Two second connection members may be configured to connect the third circuit board with the fourth circuit board, wherein the two second connection members may be formed on the third circuit board and the fourth circuit board, respectively, and wherein the fifth circuit board may be interposed between the two second connection members.

The electronic device may further include a first antenna configured to be connected to the first circuit board and a second antenna configured to be connected to the second circuit board.

The at least one first electronic component may be a first radio frequency front end (RFFE), and wherein the at least one second electronic component may be a second RFFE.

The first RFFE may be connected to the first antenna, and wherein the second RFFE may be connected to the second antenna.

The first contact point and the second contact point may be a surface disposed device (SMD) type contact point.

The first contact point and the second contact point may be connected to the first circuit board and the second circuit board, respectively.

According to one or more embodiments of the disclosure, an electronic device including a stacked PCB structure may add a signal transmission path and set various signal transmission paths because it is possible to transmit a signal through a double-sided disposing-type electronic component module as well as through an interposer connector. Besides, a wiring for signal transmission may be advantageously simplified.

According to one or more embodiments of the disclosure, because the double-sided disposing-type electronic component module may be disposed compactly between a first circuit board and a second circuit board in the electronic device, spatial arrangement efficiency may be increased.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

With reference to the attached drawings, one or more embodiments of the disclosure will be described below.

Figure 1:
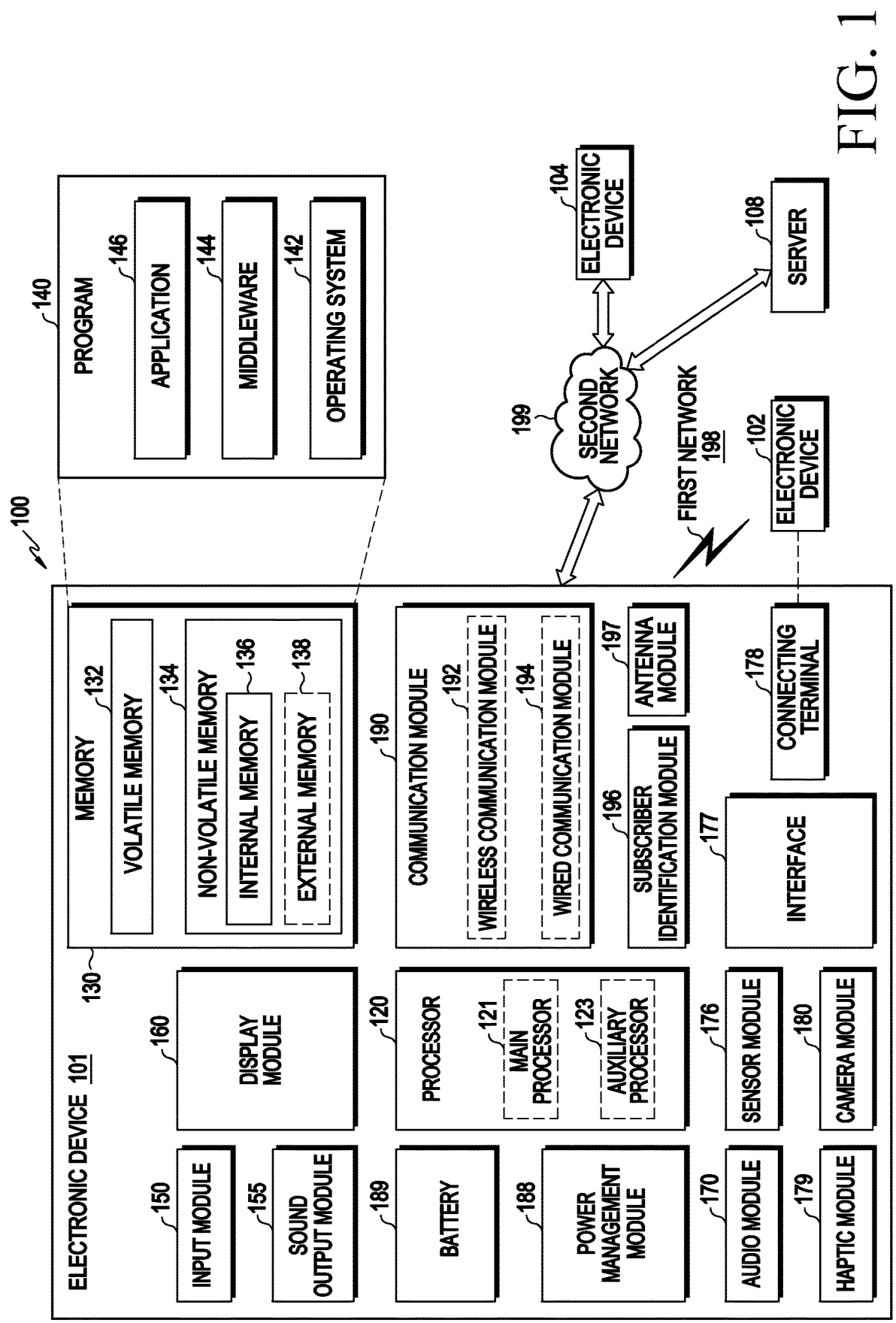
FIG. 1 is a block diagram illustrating an electronic device in a network environment according to one or more embodiments of the disclosure.

FIG. 1 is a block diagram illustrating an electronic device in a network environment according to one or more embodiments of the disclosure.

FIG. 1 is a block diagram illustrating an electronic device 101 in a network environment 100 according to one or more embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a board (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to one or more embodiments, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 may perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
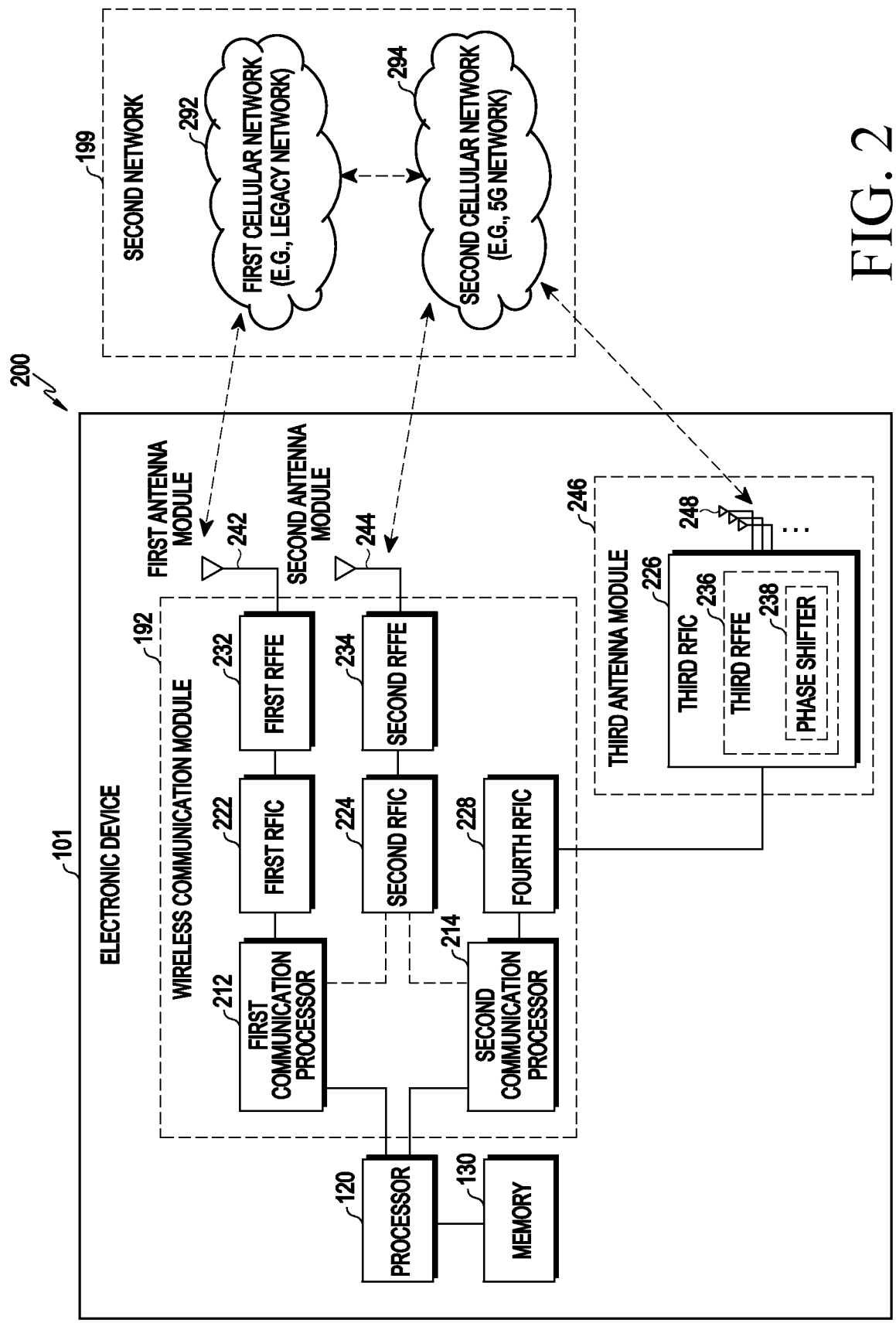
FIG. 2 is a block diagram illustrating an electronic device in a network environment including a plurality of cellular networks according to one or more embodiments of the disclosure.

FIG. 2 is a block diagram 200 illustrating the electronic device 101 in a network environment including a plurality of cellular networks according to one or more embodiments.

Referring to FIG. 2, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include the processor 120 and the memory 130. The second network 199 may include a first cellular network 292 and a second cellular network 294. According to another embodiment, the electronic device 101 may further include at least one of the components described with reference to FIG. 1, and the second network 199 may further include at least one other network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to another embodiment, the fourth RFIC 228 may be omitted or included as a part of the third RFIC 226.

The first communication processor 212 may support establishment of a communication channel in a band to be used for wireless communication with the first cellular network 292 and legacy network communication through the established communication channel. According to one or more embodiments, the first cellular network may be a legacy network including a $2^{nd}$ generation (2G), $3^{rd}$ generation (3G), $4^{th}$ generation (4G), or long term evolution (LTE) network. The second communication processor 214 may support establishment of a communication channel corresponding to a specified band (e.g., about 6 GHz to about 60 GHz) of a band to be used for wireless communication with the second cellular network 294 and $5^{th}$ (5G) network communication through the established communication channel. According to one or more embodiments, the second cellular network 294 may be a 5G network defined in the $3^{rd}$ generation partnership project (3GPP). Further, according to an embodiment, the first communication processor 212 or the second communication processor 214 may support establishment of a communication channel corresponding to another specified band (e.g., less than 6 GHz) of the band to be used for wireless communication with the second cellular network 294 and 5G network communication through the established communication channel. According to an embodiment, the first communication processor 212 and the second communication processor 214 may be implemented on a single chip or in a single package. According to one or more embodiments, the first communication processor 212 or the second communication processor 214 may be formed on a single chip or in a single package, together with the processor 120, the auxiliary processor 123, or the communication module 190.

During transmission, the first RFIC 222 may convert a baseband signal generated by the first communication processor 212 to an RF signal at about 700 MHz to about 3 GHz used in the first cellular network 292 (e.g., a legacy network). During reception, an RF signal may be obtained from the first cellular network 292 (e.g. the legacy network) through an antenna (e.g., the first antenna module 242) and preprocessed through an RFFE (e.g., the first RFFE 232). The first RFIC 222 may convert the preprocessed RF signal into a baseband signal so that the baseband signal may be processed by the first communication processor 212.

During transmission, the second RFIC 224 may convert a baseband signal generated by the first communication processor 212 or the second communication processor 214 to an RF signal (hereinafter, referred to as a 5G Sub6 RF signal) in a Sub6 band (e.g., about 6 GHz or below) used in the second cellular network 294 (e.g., a 5G network). During reception, a 5G Sub6 RF signal may be obtained from the second cellular network 294 (e.g. the 5G network) through an antenna (e.g., the second antenna module 244) and preprocessed through an RFFE (e.g., the second RFFE 234). The second RFIC 224 may convert the preprocessed 5G Sub6 RF signal into a baseband signal so that the baseband signal may be processed by a corresponding communication processor out of the first communication processor 212 and the second communication processor 214.

The third RFIC 226 may convert a baseband signal generated by the second communication processor 214 to an RF signal (hereinafter, referred to as a 5G Above6 RF signal) in a 5G Above6 band (e.g., about 6 GHz to about 60 GHz) to be used in the second cellular network 294 (e.g., the 5G network). During reception, a 5G Above6 RF signal may be obtained from the second cellular network 294 (e.g. the 5G network) through an antenna (e.g. the antenna 248) and preprocessed through the third RFFE 236. The third RFIC 226 may convert the preprocessed 5G Above6 RF signal into a baseband signal so that the baseband signal may be processed by the second communication processor 214. According to an embodiment, the third RFFE 236 may be formed as a part of the third RFIC 226.

The electronic device 101 may include the fourth RFIC 228 separately from or as at least a part of the third RFIC 226 according to an embodiment. In this case, the fourth RFIC 228 may convert a baseband signal generated by the second communication processor 214 to an RF signal (hereinafter, referred to as an intermediate frequency (IF) signal) in an IF band (e.g., about 9 GHz to about 11 GHz) and then transmit the IF signal to the third RFIC 226. The third RFIC 226 may convert the IF signal to a 5G Above6 RF signal. During reception, a 5G Above6 RF signal may be received from the second cellular network 294 (e.g. the 5G network) through an antenna (e.g., the antenna 248) and converted into an IF signal by the third RFIC 226. The fourth RFIC 228 may convert the IF signal into a baseband signal so that the baseband signal may be processed by the second communication processor 214.

According to an embodiment, the first RFIC 222 and the second RFIC 224 may be implemented as at least a part of a single chip or a single package. According to an embodiment, the first RFFE 232 and the second RFFE 234 may be implemented as at least a part of a single chip or a single package. According to an embodiment, at least one of the first antenna module 242 or the second antenna module 244 may be omitted or combined with another antenna module to process RF signals in a plurality of corresponding bands.

According to an embodiment, the third RFIC 226 and the antenna 248 may be disposed on the same board to form a third antenna module 246. For example, the wireless communication module 192 or the processor 120 may be disposed on a first board (e.g., a main PCB). In this case, the third RFIC 226 may be disposed in a partial area (e.g., on a bottom surface) of a second board (e.g. a sub PCB) separate from the first board, and the antenna 248 may be disposed in another area (e.g., on a top surface) of the second broad, thereby forming the third antenna module 246. As the third RFIC 226 and the antenna 248 are disposed on the same board, the length of a transmission line between them may be reduced. This may, for example, reduce transmission line-incurred loss (e.g., attenuation) of a signal in a high frequency band (e.g., about 6 GHz to about 60 GHz) used in 5G network communication. Therefore, the electronic device 101 may improve the quality or speed of communication with the second cellular network 294 (e.g., the 5G network).

According to an embodiment, the antenna 248 may be formed as an antenna array including a plurality of antenna elements available for beamforming. In this case, the third RFIC 226 may include a plurality of phase shifters 238 corresponding to the plurality of antenna elements, for example, as a part of the third RFFE 236. During transmission, each of the plurality of phase shifters 238 may convert the phase of a 5G Above6 RF signal to be transmitted to the outside (e.g., a base station (BS) of the 5G network) of the electronic device 101 through a corresponding antenna element. During reception, each of the plurality of phase shifters 238 may convert the phase of a 5G Above6 RF signal received from the outside through the corresponding antenna element to the same or substantially the same phase. This enables transmission or reception between the electronic device 101 and the outside through beamforming.

The second cellular network 294 (e.g. the 5G network) may operate independently of the first cellular network 292 (e.g. the legacy network) (e.g., stand-alone (SA)) or operate in connection to the first cellular network 292 (e.g. the legacy network) (e.g., non-stand-alone (NSA)). For example, the 5G network may include only an access network (e.g., a 5G radio access network (RAN) or a next-generation RAN (NG RAN)) without a core network (e.g. a next-generation core (NGC)). In this case, the electronic device 101 may access the access network of the 5G network and then access an eternal network (e.g., the Internet) under the control of a core network (e.g., an evolved packet core (EPC)) of the legacy network. Protocol information (e.g., LTE protocol information) for communication with the legacy network or protocol information (e.g., NR protocol information) for communication with the 5G network may be stored in the memory 230 and accessed by other components (e.g., the processor 120, the first communication processor 212, or the second communication processor 214).

Figure 3:
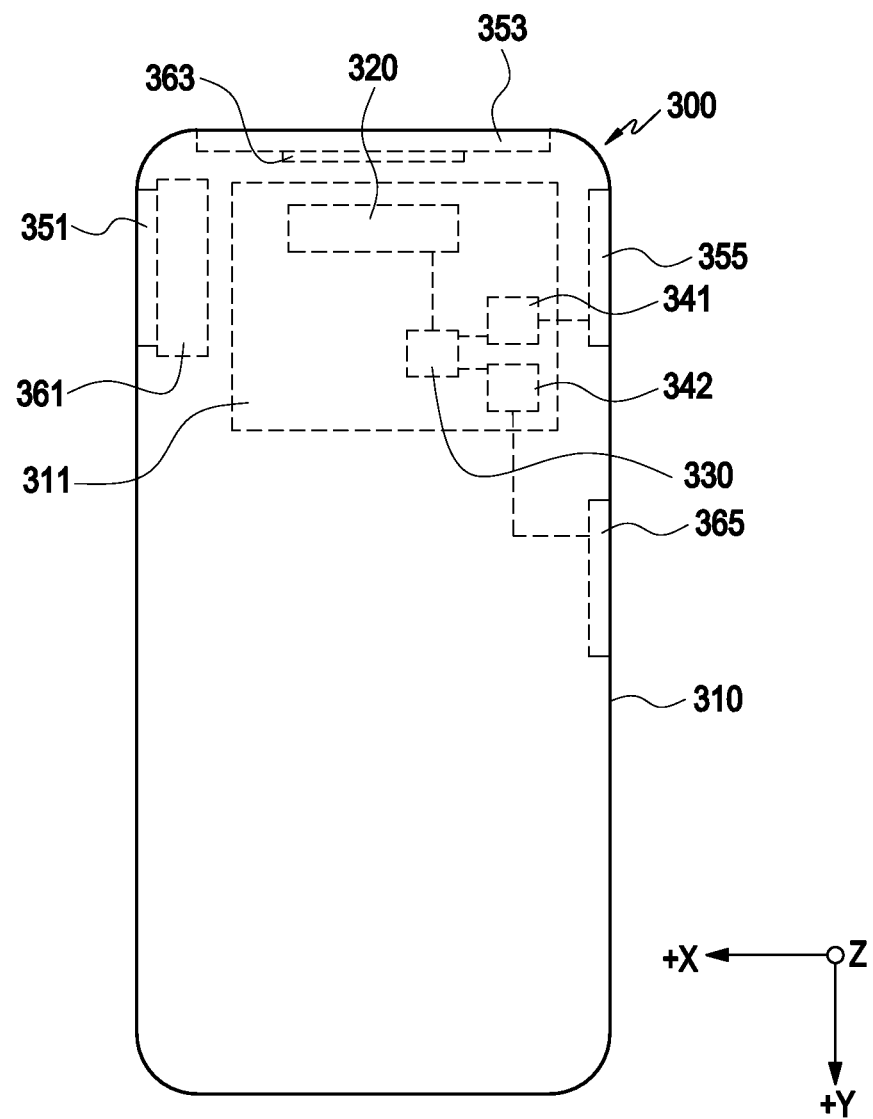
FIG. 3 is an internal conceptual diagram illustrating the structure of an electronic device including an antenna module according to one or more embodiments of the disclosure.

FIG. 3 is an internal conceptual diagram illustrating the structure of an electron device including an antenna module according to one or more embodiments of the disclosure. FIG. 3 illustrates an embodiment of the structure of the electronic device 101 illustrated in FIG. 2.

In the illustrated embodiment, an electronic device 300 (e.g., the electronic device 101 of FIG. 1) may include a housing 310 including a front plate, a rear plate (or rear glass), and a side member surrounding a space between the front plate and the rear plate.

The electronic device 300 may include a display disposed to be seen through the front plate, a PCB 311, and/or a mid-plate in an internal space of the housing 310, and may selectively further include various other components.

According to an embodiment, the electronic device 300 may include a first legacy antenna 351, a second legacy antenna 353, and/or a third legacy antenna 355 in the space and/or a part (e.g., the side member) of the housing 310. The first to third legacy antennas 351 to 355 may be used, for example, for cellular communication (e.g., 2G, 3G, 4G, or LTE)), short-range communication (e.g., WiFi, Bluetooth, or NFC), and/or the global navigation satellite system (GNSS).

According to an embodiment, the electronic device 300 may include a first antenna module 361, a second antenna module 363, and/or a third antenna module 365 to form a directional beam. For example, the antenna modules (the first antenna module 361, the second antenna module 363, and the third antenna module 365) may be used for a 5G network (e.g., the second cellular network 294 of FIG. 2), mmWave communication, 60 GHz communication, or WiGig communication. In an embodiment, the antenna modules 361 to 365 may be disposed in the space such that they are spaced apart from metal members (e.g., the housing 310, various internal electronic components, and/or the first to third legacy antennas 351 to 355) of the electronic device 101 by specified gaps.

In the embodiment illustrated in FIG. 3, the first antenna module 361 may be located at a left top end (e.g. an X-axis direction), the second antenna module 363 may be located in a middle top end (e.g. a −Y-axis direction), and the third antenna module 365 may be located at a right middle end (e.g. the −X-axis direction). In another embodiment, the electronic device 101 may include additional antenna modules at additional positions (e.g., a bottom middle end (e.g. a +Y-axis direction)) or some of the first to third antenna modules 361 to 365 may be omitted.

According to an embodiment, the first to third legacy antennas 351 to 355 and/or the first to third antenna modules 361 to 365 may be electrically connected to at least one processor 320 (e.g., an AP or a CP) on the PCB 311 by conductive lines (or wirings, coaxial cables, or FPCBs).

For example, as illustrated in FIG. 3, the third legacy antenna 355 may be connected to the processor 320 through a first RFFE 341 and/or an RF transceiver 330 disposed on the PCB 311, and the third antenna module 365 may be connected to the processor 320 through a second RFFE 342 and the RF transceiver 330 disposed on the PCB 311. In another embodiment, the first legacy antenna 351 and the second legacy antenna 353 or the first antenna module 361 and the second antenna module 363 may also be connected to the processor 320 through an RFFE or an RF transceiver.

Figure 4:
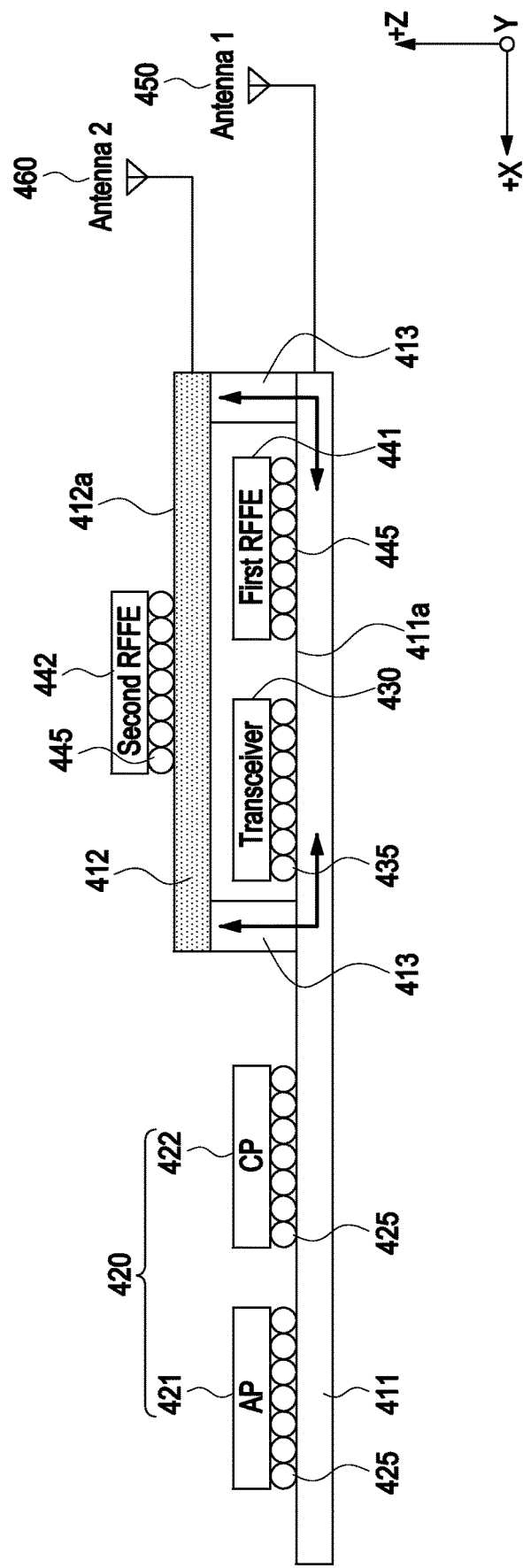
FIG. 4 is a conceptual diagram illustrating a stacked circuit board structure and electronic components disposed thereon according to a certain embodiment.

FIG. 4 is a conceptual diagram illustrating a stacked circuit board structure (hereinafter referred to as a 'stacked PCB structure') and electronic components disposed thereon.

In FIG. 4, a stacked PCB structure having electronic components for wireless communication (e.g. a first RFFE 441, a second RFFE 441, and an RF transceiver 430) disposed thereon is illustrated.

In an embodiment, the stacked PCB structure may include a first circuit board 411 and a second circuit board 412. For example, the first circuit board 411 may be connected to a first antenna 450, and the second circuit board 412 may be electrically connected to a second antenna 460. The first antenna 450 may include, for example, any one of first to third legacy antennas (e.g., the first to third legacy antennas 351, 353, and 355 of FIG. 3) and first to third antenna modules (e.g., the first to third antenna modules 361, 363, and 365 of FIG. 3). The second antenna 460 may include, for example, any one of first to third legacy antennas (e.g., the first to third legacy antennas 351, 353, and 355 of FIG. 3) and first to third antenna modules (e.g., the first to third antenna modules 361, 363, and 365 of FIG. 3) other than the first antenna 450.

According to an embodiment, a plurality of electronic components may be disposed on the first circuit board 411. For example, an AP 421, a CP 422, the RF transceiver 430, and/or the first RFFE 441 may be disposed on the first circuit board 411. In an embodiment, an electronic device (e.g., the electronic device 300 of FIG. 3) may further include the second circuit board 412 to efficiently use an inner arrangement space of a housing (e.g., the housing 310 of FIG. 3). In an embodiment, the first circuit board 411 and the second circuit board 412 may be connected to each other through at least one connection member 413 (e.g., an interposer connector). For example, the connection member 413 may have terminals for an electrical connection between boards, which are packaged with an insulating material (e.g., silicone (Si), glass, or ceramic). A shielding material (e.g. a plating layer) may be applied to the exterior of the insulating material to improve shielding performance. The first circuit board 411 and the second circuit board 412 may be formed to be spaced apart from each other by a predetermined distance in a height direction (e.g. a +Z-axis direction) through the connection member 413. In an embodiment, at least one electronic component may be disposed on the first circuit board 411 or the second circuit board 412. For example, the RF transceiver 430 and/or the first RFFE 441 may be disposed on one surface 411a of the first circuit board 411, and the second RFFE 442 may be disposed on one surface 412a of the second circuit board 412.

According to an embodiment, the insufficient arrangement space of the electronic device may be effectively utilized by providing the stacked PCB structure, using the connection member (e.g. the interposer connector). However, even if the stacked PCB structure is applied, a signal transmission path may be limited because a signal is transmitted between the two boards (the first circuit board 411 and the second circuit board 412) only through the connection member 413, thereby limiting improvement of the spatial utilization, component layout, and/or spatial arrangement efficiency of the electronic device.

According to an embodiment, electronic components such as the AP 421, the CP 422, the RF transceiver 430, the first RFFE 441, or the second RFFE 442 may be disposed on and electrically connected to the boards (e.g., the first circuit board 411 and the second circuit board 412) through contact points 425, 435, and 445. For example, electronic components such as the AP 421, the CP 422, the RF transceiver 430, the first RFFE 441, or the second RFFE 442 may be disposed on the boards (e.g., the first circuit board 411 and the second circuit board 412) through a ball grid array (BGA) or a land grid array (LGA).

Figure 5:
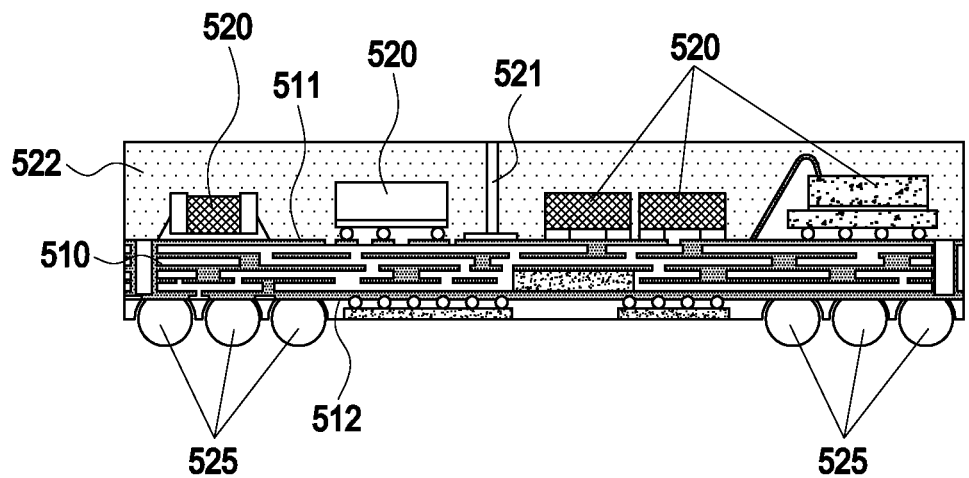
FIG. 5 is a diagram illustrating an electronic component module according to one or more embodiments of the disclosure.
Figure 6:
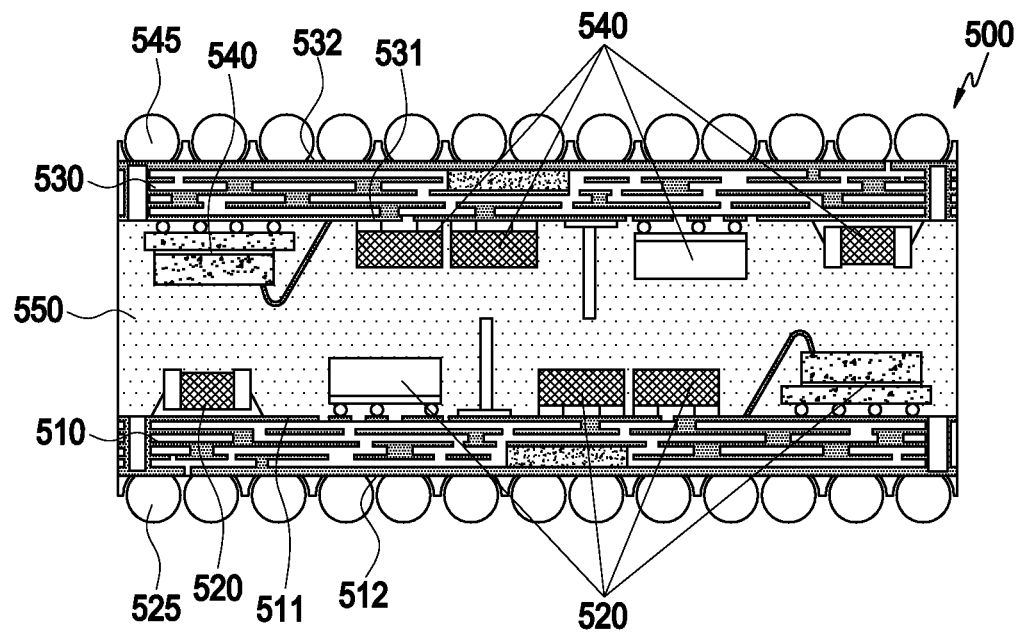
FIG. 6 is a diagram illustrating a double-sided disposing-type electronic component module according to an embodiment of the disclosure.
Figure 7:
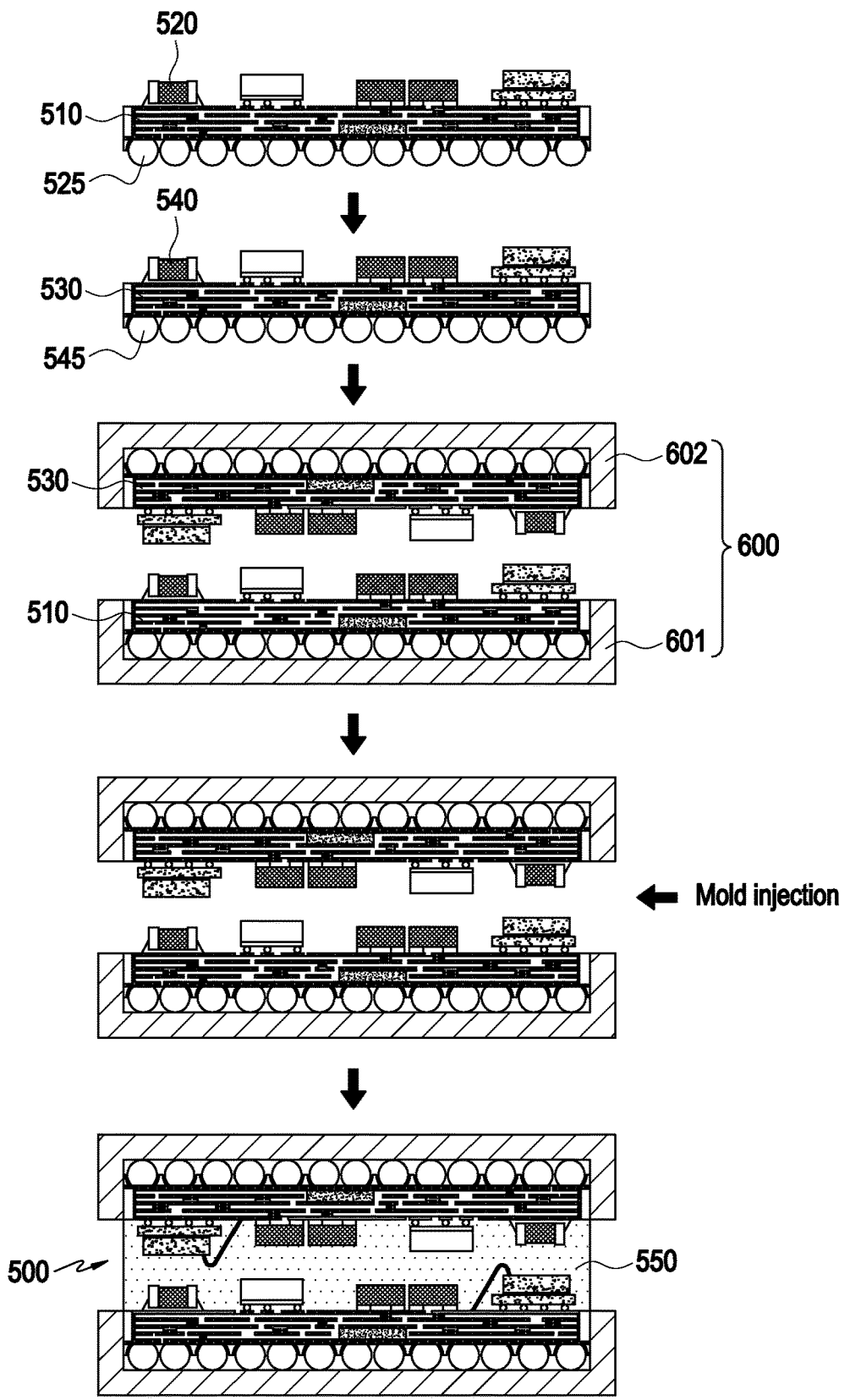
FIG. 7 is a diagram illustrating a process of manufacturing a double-sided disposing-type electronic component module according to an embodiment of the disclosure.
Figure 8:
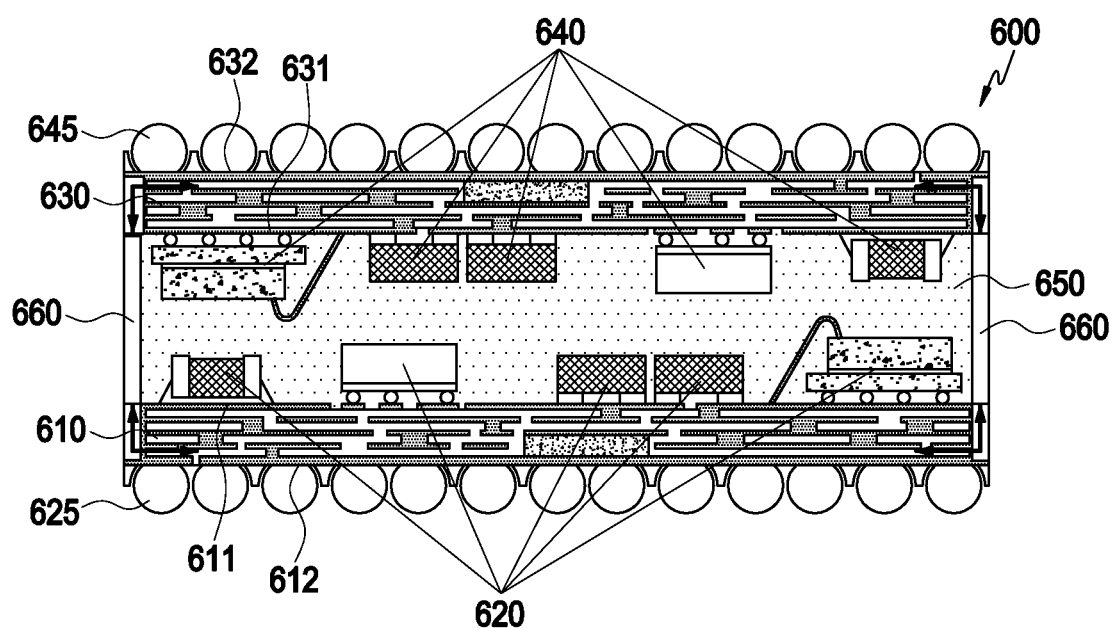
FIG. 8 is a diagram illustrating a double-sided disposing-type electronic component module according to another embodiment of the disclosure.
Figure 9:
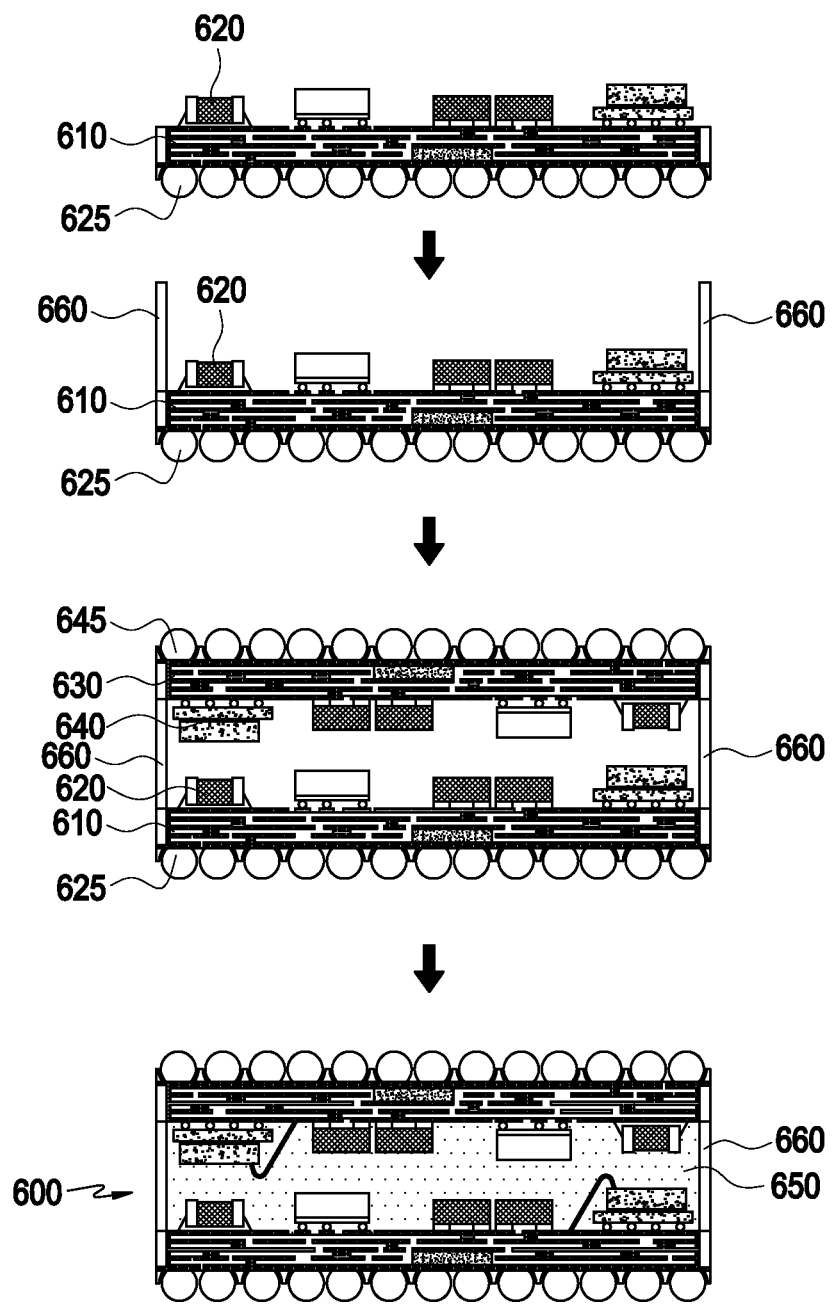
FIG. 9 is a diagram illustrating a process of manufacturing a double-sided disposing-type electronic component module according to another embodiment of the disclosure.
Figure 10:
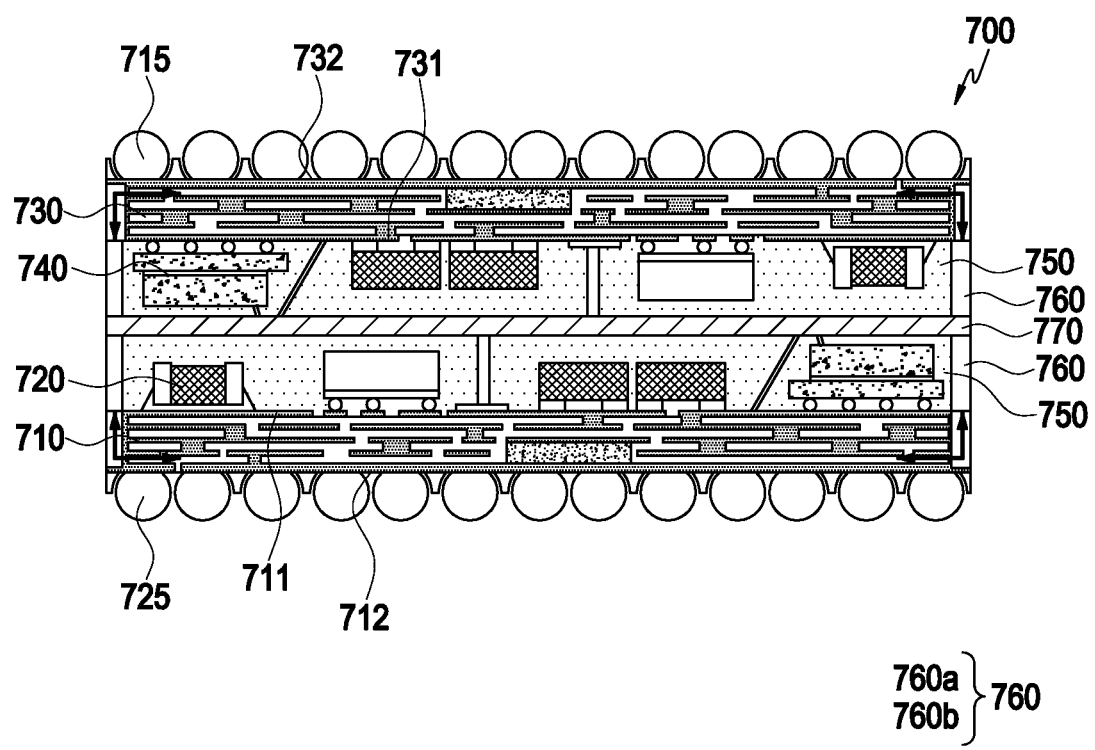
FIG. 10 is a diagram illustrating a double-sided disposing-type electronic component module according to another embodiment of the disclosure.

Embodiments illustrated in FIGS. 5 to 12 are intended to provide a double-sided disposing-type electronic component module (e.g., a double-sided disposing-type electronic component module 500 of FIG. 6, a double-sided disposing-type electronic component module 600 of FIG. 8, and a double-sided disposing-type electronic component module 700 of FIG. 10) for securing an additional signal transmission path in a stacked PCB structure using a connection member (e.g., an interposer connector) and improving the spatial utility, component layout, and/or spatial arrangement efficiency of an electronic device.

FIG. 5 is a diagram illustrating an electronic component module according to one or more embodiments of the disclosure. FIG. 6 is a diagram illustrating the double-sided disposing-type electronic component module 500 according to an embodiment of the disclosure.

Referring to FIG. 5, the electronic component module may include a third circuit board 510, an electronic component 520 disposed on one surface 511 of the third circuit board 510, and a contact point 525 disposed on a second surface 512 of the third circuit board 510.

In one or more embodiments of the disclosure, the type and form of the electronic component 520 included in the electronic component module are not limited to any specific ones. The electronic component 520 may include, for example, a communication device, a processor, memory, an RFFE, an RF transceiver, a power management module, a wireless communication circuit, and/or an interface. The processor may include, for example, at least one of a CPU, an AP, a GPU, an image signal processor, a sensor hub processor, or a CP. According to an embodiment, the processor may include at least a CP or an integrated configuration of an AP and a CP, and control or drive the RF transceiver, the power management module, or the wireless communication circuit. The electronic component module may include a plurality of electronic components or devices to implement at least one function.

According to one or more embodiments, the contact point 525 of the electronic component module is a component for electrical connection to a first circuit board (e.g., the first circuit board 411 of FIG. 4) of the electronic device, and may be implemented in the form of a pad including a plurality of contact points having the same function. According to an embodiment, the electronic component module may be surface-disposed on the first circuit board (e.g., the first circuit board 411 of FIG. 4) of the electronic device through the contact point 525. For example, the contact point 525 may be disposed on and electrically connected to a contact point or pad of the first circuit board (e.g., the first circuit board 411 of FIG. 4) through a BGA or LGA.

According to one or more embodiments, electronic components included in the electronic component module may include a wall structure 521 for shielding from the magnetic impact of other electronic components included in the electronic component module. In another example, the electronic component module may cover the electronic component 520 to protect it from external impact, and include a molding portion 522 for stable arrangement on the board 510.

According to one or more embodiments of the disclosure, a pair of such electronic component modules as illustrated in FIG. 5 may be implemented as the double-sided disposing-type electronic component module 500 of FIG. 6. In the following description, a 'connection' between one component and another component may include a physical and electrical connection and an indirect or direct connection, unless otherwise stated.

Referring to FIG. 6, according to an embodiment, the double-sided disposing-type electronic component module 500 may include the third circuit board 510 facing the first circuit board (e.g., the first circuit board 411 of FIG. 4) and a fourth circuit board 530 facing a second circuit board (e.g., the second circuit board 412 of FIG. 4). At least one first electronic component 520 may be disposed on the first surface 511 of the third circuit board 510, and at least one second electronic component 540 may be disposed on a third surface 531 of the fourth circuit board 530. When it is said that one component 'faces' another component, this may include a whole or partial contact into which the one component is brought with the other component. For example, the third circuit board 510 and the fourth circuit board 530 may wholly or partially face the first circuit board (e.g., the first circuit board 411 of FIG. 4) and the second circuit board (e.g., the second circuit board 412 of FIG. 4) through contact points 525 and 545, respectively. In an embodiment, the double-sided disposing-type electronic component module 500 may include a first contact point 525 disposed on the second surface 512 of the third circuit board 510 and connecting the first circuit board (e.g., the first circuit board 411 of FIG. 4) with the third circuit board 510. In another example, the electronic component module 500 may include a second contact point 545 disposed on a fourth surface 532 of the fourth circuit board 530 and connecting the second circuit board (e.g., the second circuit board 412 of FIG. 4) with the fourth circuit board 530. For example, the contact points 525 and 545 may be implemented in the form of a plurality of pads or balls with the substantially same function. According to an embodiment, the electronic component modules may be surface-disposed on the first circuit board 411 and the second circuit board 412 of the electronic device.

According to an embodiment, although the first electronic component 520 or the second electronic component 540 is used as singular, it may be plural in number, and a plurality of electronic components may be integrally formed into a module performing one or more functions. Although the first electronic component 520 or the second electronic component 540 for performing at least one function may include one component, it may be formed as a combination of a plurality of components to perform one or more functions. Further, the first electronic component 520 or the second electronic component 540 may include a different type of electronic component inside the module.

According to an embodiment, the third circuit board 510 and the first electronic component 520 disposed on the third circuit board 510 may implement at least one function. The fourth circuit board 530 and the second electronic component 540 disposed on the fourth circuit board 530 may implement at least one function. According to an embodiment, the function of the third circuit board 510 and the first electronic component 520 disposed on the third circuit board 510 may be substantially the same as or different from the function of the fourth circuit board 530 and the second electronic component 540 disposed on the fourth circuit board 530.

According to an embodiment, the double-sided disposing-type electronic component module 500 may further include a molding portion 550. The molding portion 550 may fill a space between the first electronic component 520 and the second electronic component 540 and cover the first electronic component 520 and the second electronic component 540 to protect them from external impact. The double-sided disposing-type electronic component module 500 may be formed on a single chip or in a single package by the molding portion 550.

FIG. 7 is a diagram illustrating a process of manufacturing a double-sided disposing-type electronic component module according to an embodiment of the disclosure. A description will be given of a method of manufacturing the double-sided disposing-type electronic component module 500 according to the embodiment illustrated in FIG. 6.

According to the embodiment illustrated in FIG. 7, the third circuit board 510 with the first electronic component 520 disposed thereon and the fourth circuit board 530 with the second electronic component 540 disposed thereon may be prepared. According to an embodiment, the third circuit board 510 with the first electronic component 520 disposed thereon may be seated in a first mold (or lower case) 601, and the fourth circuit board 530 with the second electronic component 540 disposed thereon may be seated in a second mold (or upper case) 602. Herein, the first electronic component 520 and the second electronic component 540 may be spaced apart from each other and disposed on mutually facing surfaces of the third circuit board 510 and the fourth circuit board 530. In this state, the molding portion 550 may be formed by dissolving a plastic resin in a space between the first electronic component 520 and the second electronic component 540, injecting the melted material, and then curing the injected material for a specific time.

FIG. 8 is a diagram illustrating the double-sided disposing-type electronic component module 600 according to another embodiment of the disclosure.

According to one or more embodiments of the disclosure, the double-sided disposing-type electronic component module 600 may include a third circuit board 610 facing a first circuit board (e.g., the first circuit board 411 of FIG. 4) and a fourth circuit board 630 facing a second circuit board (e.g., the second circuit board 412 of FIG. 4). At least one first electronic component 620 may be disposed on the third circuit board 610, and at least one second electronic component 640 may be disposed on the fourth circuit board 630. In an embodiment, the double-sided disposing-type electronic component module 600 may include a first contact point 625 disposed on a second surface 612 of the third circuit board 610 and connecting the first circuit board (e.g., the first circuit board 411 of FIG. 4) with the third circuit board 610. In another example, the double-sided disposing-type electronic component module 600 may include a second contact point 645 disposed on a fourth surface 632 of the fourth circuit board 630 and connecting the second circuit board (e.g., the second circuit board 412 of FIG. 4) with the fourth circuit board 630.

According to an embodiment, the third circuit board 610 and the first electronic component 620 disposed on the third circuit board 610 may implement at least one function. The fourth circuit board 630 and the second electronic component 640 disposed on the fourth circuit board 630 may implement at least one function. According to an embodiment, the function of the third circuit board 610 and the first electronic component 620 disposed on the third circuit board 610 may be substantially the same as or different from the function of the fourth circuit board 630 and the second electronic component 640 disposed on the fourth circuit board 630.

According to an embodiment, the double-sided disposing-type electronic component module 600 may further include a molding portion 650. The molding portion 650 may fill a space between the first electronic component 620 and the second electronic component 640 and cover the first electronic component 620 and the second electronic component 640 to protect them from external impact. The double-sided disposing-type electronic component module 600 may be formed in the form of a single chip or a single package by the molding portion 650.

According to one or more embodiments, the double-sided disposing-type electronic component module 600 may further include at least one internal connection member 660. The internal connection member 660 may be implemented as a copper (Cu) pillar structure according to an embodiment or as solder bumps structure according to another embodiment. The internal connection member 660 may be at the outermost periphery of the molding portion 650 or may be introduced inward from the outermost periphery of the molding portion 650 by a specific distance. The first electronic component 620 and the second electronic component 640 may be electrically connected to each other, and the third circuit board 610 and the fourth circuit board 630 may be electrically connected to each other, through the internal connection member 660 in the double-sided disposing-type electronic component module 600.

According to an embodiment, the double-sided disposing-type electronic component module 600 illustrated in FIG. 8 includes, but not limited to, two internal connection members 660. For example, the double-sided disposing-type electronic component module 600 may include one internal connection member 660 or three or more internal connection members 660.

FIG. 9 is a diagram illustrating a process of manufacturing a double-sided disposing-type electronic component module according to another embodiment of the disclosure.

According to the embodiment illustrated in FIG. 9, the third circuit board 610 with the first electronic component 620 disposed thereon and the fourth circuit board 630 with the second electronic component 640 disposed thereon may be prepared. According to an embodiment, the internal connection member 660 may be formed at an edge of the third circuit board 610 or the fourth circuit board 630. Although the internal connection member 660 is shown as extending from an edge of the third circuit board to one side of the fourth circuit board 630 in FIG. 9, the disclosure is not necessarily limited thereto. For example, the internal connection member 660 according to the embodiment illustrated in FIG. 9 may have a greater height than the first electronic component 620, and the fourth circuit board 630 with the second electronic component 640 disposed thereon may be stacked on the internal connection member 660. In another example, an internal connection member may be formed at an edge of the fourth circuit board 630. The internal connection member may have a greater height than the second electronic component 640, and the third circuit board 610 with the first electronic component 620 disposed thereon may be stacked on the internal connection member. In one embodiment, the third circuit board 610 with the first electronic component 620 disposed thereon may be seated in a first mold (or lower case) (e.g., 601 in FIG. 7), and the fourth circuit board 630 with the second electronic component 640 disposed thereon may be seated in a second mold (or upper case) (e.g., 602 in FIG. 7). Herein, the first electronic component 620 and the second electronic component 640 may face each other, spaced apart from each other. In this state, the molding portion 650 may be formed by dissolving a plastic resin in a space between the first electronic component 620 and the second electronic component 640, injecting the melted material, and then curing the injected material for a specific time.

FIG. 10 is a diagram illustrating the double-sided disposing-type electronic component module 700 according to another embodiment of the disclosure.

According to one or more embodiments of the disclosure, the double-sided disposing-type electronic component module 700 may include a third circuit board 710 facing a first circuit board (e.g., the first circuit board 411 of FIG. 4) and a fourth circuit board 730 facing a second circuit board (e.g., the second circuit board 412 of FIG. 4). At least one first electronic component 720 may be disposed on the third circuit board 710, and at least one second electronic component 740 may be disposed on the fourth circuit board 730. In an embodiment, the double-sided disposing-type electronic component module 700 may include a first contact point 725 disposed on a second surface 712 of the third circuit board 710 and connecting the first circuit board (e.g., the first circuit board 411 of FIG. 4) with the third circuit board 710. In another example, the double-sided disposing-type electronic component module 700 may include a second contact point 745 disposed on a fourth surface 732 of the fourth circuit board 730 and connecting the second circuit board (e.g., the second circuit board 412 of FIG. 4) with the fourth circuit board 730.

According to an embodiment, the third circuit board 710 and the first electronic component 720 disposed on the third circuit board 710 may implement at least one function. The fourth circuit board 730 and the second electronic component 740 disposed on the fourth circuit board 730 may implement at least one function. According to an embodiment, the function of the third circuit board 710 and the first electronic component 720 disposed on the third circuit board 710 may be substantially the same as or different from the function of the fourth circuit board 730 and the second electronic component 740 disposed on the fourth circuit board 730.

According to an embodiment, the double-sided disposing-type electronic component module 700 may further include a molding portion 750. The molding portion 750 may fill a space between the first electronic component 720 and the second electronic component 740 and cover the first electronic component 720 and the second electronic component 740 to protect them from external impact. The double-sided disposing-type electronic component module 700 may be formed in the form of a single chip or a single package by the molding portion 750.

According to one or more embodiments, the double-sided disposing-type electronic component module 700 may further include at least one internal connection member 760. The internal connection member 760 may be implemented as a Cu pillar structure according to an embodiment or as solder bumps structure according to another embodiment. The internal connection member 760 may be at the outermost periphery of the molding portion 750 or may be introduced inward from the outermost periphery of the molding portion 750 by a specific distance. The first electronic component 720 and the second electronic component 740 may be electrically connected, and the third circuit board 710 and the fourth circuit board 730 may be electrically connected, through the internal connection member 760 in the double-sided disposing-type electronic component module 700.

According to one or more embodiments, the double-sided disposing-type electronic component module 700 may further include a fifth circuit board 770. The fifth circuit board 770 may be located between the third circuit board 710 and the fourth circuit board 730. In an embodiment, the first electronic component 720, the second electronic component 740, the third circuit board 710, and the fourth circuit board 730 of the double-sided disposing-type electronic component module 700 may also be electrically connected through the fifth circuit board 770. According to an embodiment, when the fifth circuit board 770 is further included in the double-sided disposing-type electronic component module 700 including the internal connection member 760, the length of the internal connection member 760 may be reduced, thereby reinforcing the rigidity of an assembly.

For example, the length of the internal connection member 760 of FIG. 10 may be shorter than the length of the internal connection member 660 of FIG. 8. For example, one (e.g., a first internal connection member 760*a*) of internal connection members 760 in FIG. 10 may be formed to electrically connect the third circuit board 710 with the fifth circuit board 770, and another (e.g., a second internal connection member 760*b*) of the internal connection members 760 may be formed to electrically connect the fourth circuit board 730 with the fifth circuit board 770. The total extension length of the internal connection members 760 may be the sum of the length of the first internal connection member 760*a* provided on one side of the third circuit board 710 and the length of the second internal connection member 760*b* provided on one side of the fourth circuit board 730. Accordingly, referring to FIGS. 8 and 10, the total extension length of the internal connection members 760 may be reduced by at least the thickness of the fifth circuit board 770.

Figure 11:
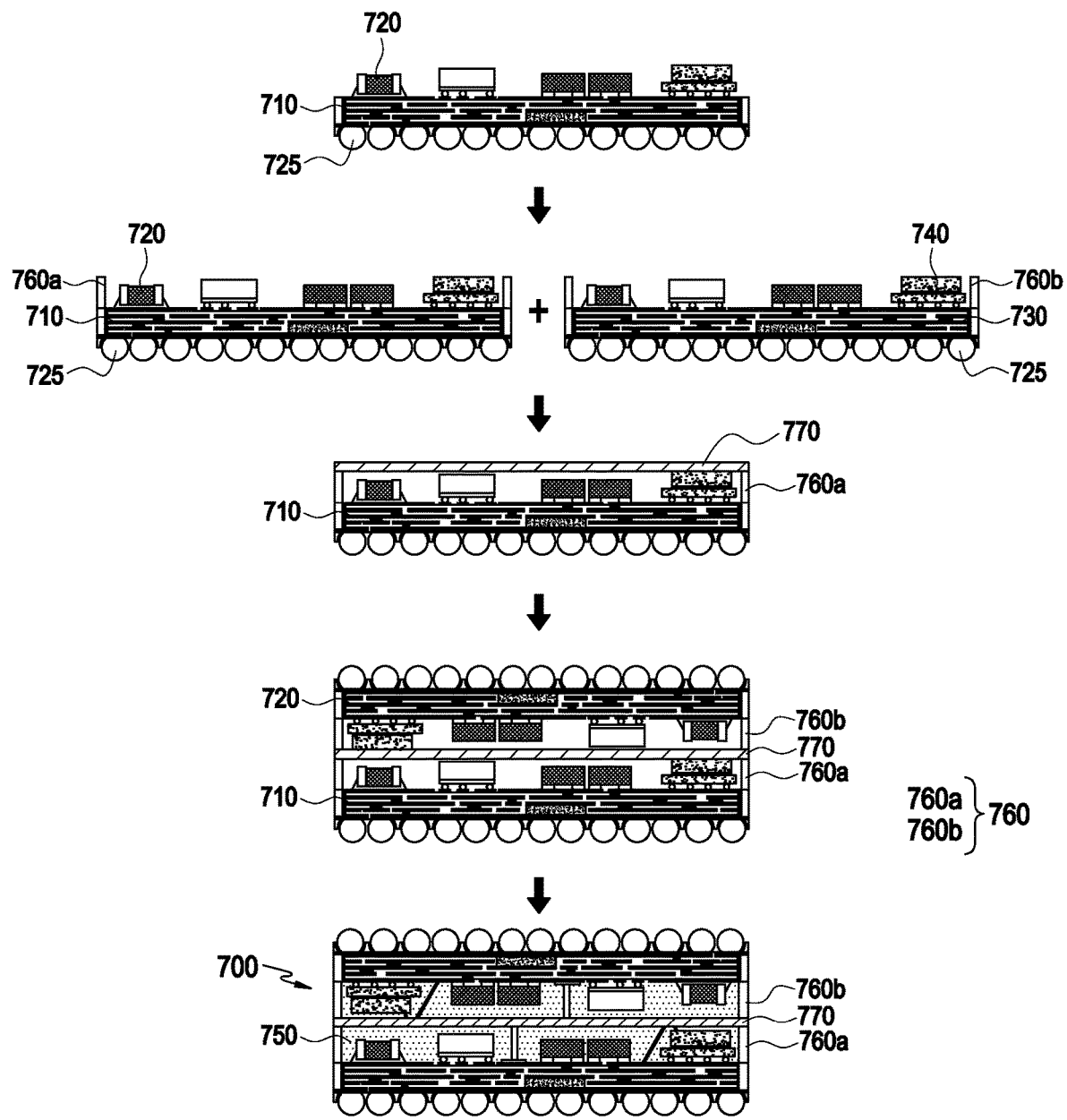
FIG. 11 is a diagram illustrating a process of manufacturing a double-sided disposing-type electronic component module according to another embodiment of the disclosure.

FIG. 11 is a diagram illustrating a process of manufacturing a double-sided disposing-type electronic component module according to another embodiment of the disclosure.

According to the embodiment illustrated in FIG. 11, the third circuit board 710 with the first electronic component 720 disposed thereon and the fourth circuit board 730 with the second electronic component 740 disposed thereon may be prepared. According to an embodiment, an internal connection member 760 may be formed at an edge of the third circuit board 710. In another example, an internal connection member 760 may also be formed at an edge of the fourth circuit board 730. According to the embodiment illustrated in FIG. 11, the first internal connection member 760*a* may be disposed on the third circuit board 710 with the first electronic component 720 disposed thereon, and the second internal connection member 760*b* may be disposed on the fourth circuit board 730 with the second electronic component 740 disposed thereon. In an embodiment, the fifth circuit board 770 may be stacked on the first internal connection member 760*a* provided on the third circuit board 710, and the fourth circuit board 730 with the second electronic component 740 disposed thereon may be stacked on the fifth circuit board 770. An electrical connection may be possible between the first electronic component 720, the second electronic component 740, the third circuit board 710, or the fourth circuit board 730 through the fifth circuit board 770. However, it is to be noted that the fifth circuit board 770 may be stacked on the second internal connection member 760*b* provided on the fourth circuit board 730, and the third circuit board 710 with the first electronic component 720 disposed thereon may be stacked on the fifth circuit board 770.

In one embodiment, the third circuit board 710 with the first electronic component 720 disposed thereon may be seated in a first mold (or lower case) (e.g., the first mold (or lower case) 601 of FIG. 7), and the fourth circuit board 730 with the second electronic component 740 disposed thereon may be seated in a second mold (or upper case) (e.g., the second mold (or upper case) 602 of FIG. 7). Herein, the first electronic component 720 and the second electronic component 740 may face each other. In this state, the molding portion 750 may be formed by dissolving a plastic resin in a space between the first electronic component 720 and the second electronic component 740, injecting the melted material, and then curing the injected material for a specific time.

Figure 12:
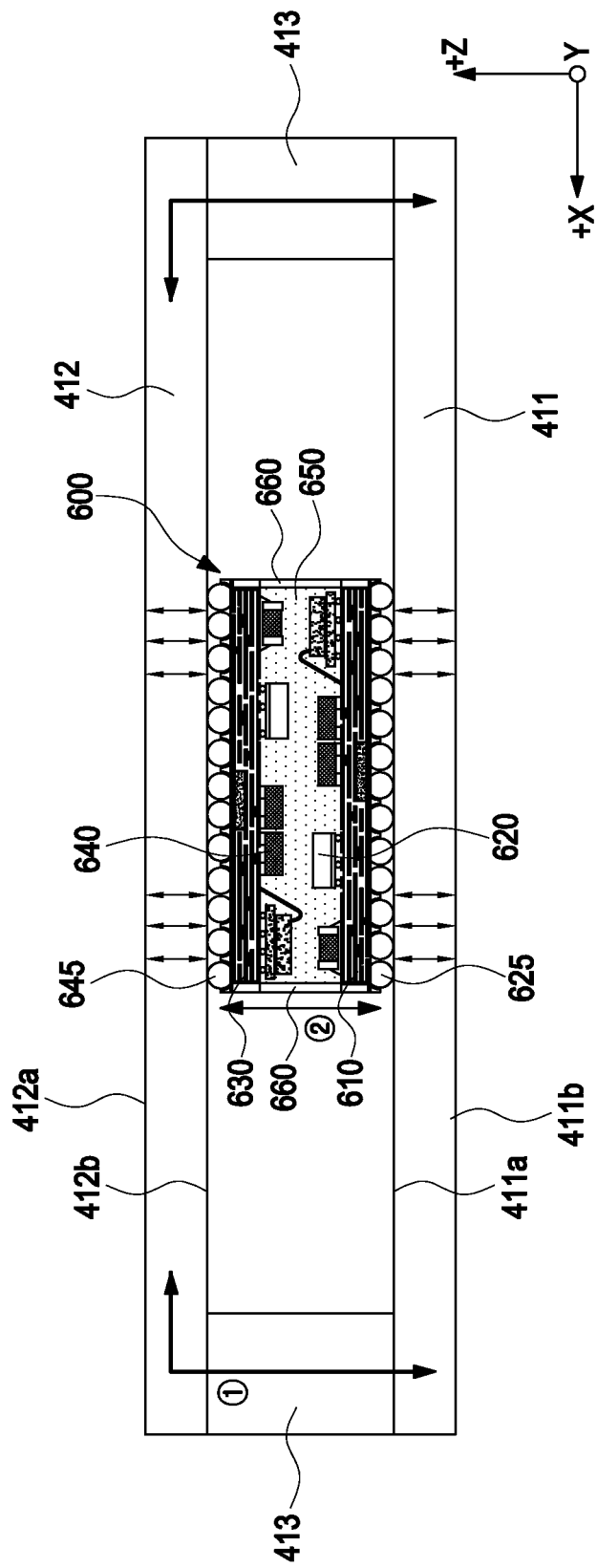
FIG. 12 is a diagram illustrating a double-sided disposing-type electronic component module disposed between a first circuit board and a second circuit board according to one or more embodiments of the disclosure.

FIG. 12 is a diagram illustrating the double-sided disposing-type electronic component module 600 disposed between the first circuit board 411 and the second circuit board 412 according to one or more embodiments of the disclosure. In the embodiment of FIG. 12, the double-sided disposing-type electronic component module 600 having the internal connection member 660 is described as an example, to which the disclosure is not necessarily limited. While the following description is given in the context of the electronic component module 600 according to the embodiment illustrated in FIG. 8, the electronic component modules 500 and 700 each having an internal connection member according to the foregoing embodiments of FIGS. 6 and 10 are applicable to the embodiment of FIG. 12.

According to one or more embodiments of the disclosure, the electronic device may include the first circuit board 411 with at least one double-sided disposing-type electronic component module 600 disposed thereon, at least one external connection member (e.g., interposer connector) (hereinafter, referred to as the 'first connection member 413') disposed on the first circuit board 411, and the second circuit board 412 stacked on the at least one first connection member 413. The first circuit board 411 may include the first surface 411a facing in a first direction (e.g. the +Z-axis direction) and the second surface 411b facing in a second direction (e.g. the −Z-axis direction) opposite to the first direction. The second circuit board 412 may include the third surface 412a facing in the first direction and the fourth surface 412b facing in the second direction opposite to the first direction. For example, the first direction may be parallel to the +Z axis.

Referring to FIG. 12, the third circuit board 610 of the double-sided disposing-type electronic component module 600 may face the first circuit board 411 and be electrically connected to the first circuit board 411 through the first contact point 625. According to another embodiment, the fourth circuit board 630 may face the second circuit board 412 and be electrically connected to the second circuit board 412 through the contact point 645.

According to one or more embodiments, the double-sided disposing-type electronic component module 600 may enable an electrical connection between the third circuit board 610 and the fourth circuit board 630 through an internal connection member (hereinafter, referred to as the 'second connection member 660').

According to one or more embodiments, the first connection member 413 may be formed to have substantially the same height as the height of the double-sided disposing-type electronic component module 600 between the first circuit board 411 and the second circuit board 412. Accordingly, since the double-sided disposing-type electronic component module 600 may be compactly disposed between the first circuit board 411 and the second circuit board 412, spatial utilization, component layout, and/or spatial arrangement efficiency may be improved.

As illustrated in FIG. 12, the double-sided disposing-type electronic component module 600 may be disposed between the first circuit board 411 and the second circuit board 412 of the stacked PCB structure, and both surfaces of the double-sided disposing-type electronic component module 600 may be electrically connected to the stacked PCB structure in the electronic device according to an embodiment. For example, the double-sided disposing-type electronic component module 600 may be compactly inserted between the first circuit board 411 and the second circuit board 412 and be electrically connected to the first surface 411a of the first circuit board 411 and the fourth surface 412b of the second circuit board 412.

In the electronic device according to one or more embodiments of the disclosure, as the first circuit board 411 and the second circuit board 412 are electrically connected by the first connection member 413, a first signal transmission path ① may be formed along the first connection member 413. In addition, in the electronic device according to one or more embodiments of the disclosure, as the third circuit board 510 and the fourth circuit board 530 are electrically connected by the second connection member 660, a second signal transmission path ② may be formed along the second connection member 660. For example, the electronic device may advantageously select and set a signal transmission path in various manners through the first connection member 413 and/or the second connection member 660, and further simplify a wiring for signal transmission.

Figure 13:
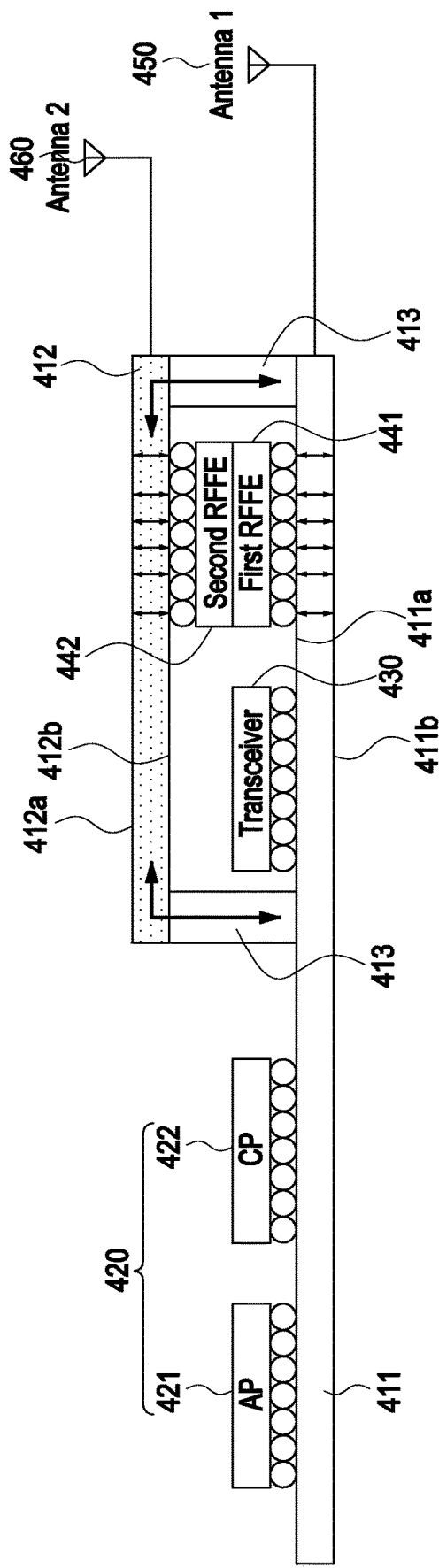
FIG. 13 is a conceptual diagram illustrating a stacked circuit board structure and electronic components arranged thereon according to one or more embodiments of the disclosure.

FIG. 13 is a conceptual diagram illustrating a stacked PCB structure and electronic components disposed thereon according to one or more embodiments of the disclosure. FIG. 13 may illustrate an embodiment in which the embodiment described with reference to FIG. 12 is applied to a wireless communication module.

FIG. 13 illustrates a stacked PCB structure on which electronic components for wireless communication (e.g., the first RFFE 441, the second RFFE 442, and the RF transceiver 430) are disposed. The stacked PCB structure may include the first circuit board (e.g., a main PCB) 411 and the second circuit board (e.g. a sub PCB) 412. In an embodiment, the first circuit board 411 may be connected to the first antenna 450, and the second circuit board 412 may be connected to the second antenna 460. For example, the first antenna 450 may be any one of first to third legacy antennas (e.g., the first to third legacy antennas 351, 353, and 355 of FIG. 3) and first to third antenna modules (e.g., the first to third antenna modules 361, 363, and 365 of FIG. 3). In another example, the second antenna 460 may be any one of first to third legacy antennas (e.g., the first to third legacy antennas 351, 353, and 355 of FIG. 3) and first to third antenna modules (e.g., the first to third antenna modules 361, 363, and 365 of FIG. 3) other than the first antenna 450.

The embodiment described with reference to FIG. 4 has disclosed the stacked PCB structure in which the first RFFE 441, the second RFFE 442, and the RF transceiver 430 are separated from each other and disposed on the first surface 411a of the first circuit board 411 or the third surface 412a of the second circuit board 412. In contrast, the embodiment illustrated in FIG. 13 has disclosed an electronic component module having both surfaces disposed on the first surface 411a of the first circuit board 411 and the fourth surface 412b of the second circuit board 412, respectively.

In a comparison between the embodiment illustrated in FIG. 4 and the embodiment illustrated in FIG. 13, the first RFFE 441 and the second RFFE 442 of FIG. 4 may be implemented as a double-sided disposing-type electronic component module (e.g., the double-sided disposing-type electronic component module 600 of FIG. 12) in FIG. 13. For example, referring back to FIG. 12, the first RFFE 441 may be implemented through an assembly of the third circuit board 610 and the first electronic component 620, and the second RFFE 442 may be implemented through an assembly of the fourth circuit board 630 and the second electronic component 640. In the embodiment illustrated in FIG. 13, the second RFFE 442 may be disposed under the second circuit board 412, thereby improving the spatial arrangement efficiency of the electronic device, compared to the embodiment illustrated in FIG. 4. Compared to the embodiment illustrated in FIG. 4, a signal transmission path is added through the first RFFE 441 and the second RFFE 442 to the signal transmission path through the first connection member 413 in the embodiment illustrated in FIG. 13. Accordingly, signal transmission paths may be advantageously diversified. While signal transmission between the RF transceiver 430 and the second RFFE 442 or signal transmission between the first RFFE 441 and the second RFFE 442 are performed only through the first connection member 413 (or an external connection member) (e.g., an interposer connector) formed at an edge of the stacked PCB structure in the embodiment illustrated in FIG. 4, a signal is also transmitted through the first RFFE 441 and the second RFFE 442 in the embodiment illustrated in FIG. 13, thereby shortening the signal transmission path. This advantage may be useful in communication using the first antenna 450 and the second antenna 460.

The electronic device according to one or more embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

One or more embodiments of the present disclosure and the terms used therein may be not intended to limit the technological features set forth herein to particular embodiments and include various changes, equivalents, or replacements for a corresponding embodiment. With regard to the description of the drawings, similar reference numerals may be used to refer to similar or related elements. A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as and or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with one or more embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

One or more embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to one or more embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one or more embodiments, each component (e.g., a module or a program) of the above-described components may include a single entity or multiple entities, and some of the multiple entities may be separately disposed in different components. According to one or more embodiments, one or more of the above-described components may be omitted, or one or more other components may be added. Alternatively or additionally, a plurality of components (e.g., modules or programs) may be integrated into a single component. In such a case, according to one or more embodiments, the integrated component may still perform one or more functions of each of the plurality of components in the same or similar manner as they are performed by a corresponding one of the plurality of components before the integration. According to one or more embodiments, operations performed by the module, the program, or another component may be carried out sequentially, in parallel, repeatedly, or heuristically, or one or more of the operations may be executed in a different order or omitted, or one or more other operations may be added.

According to one or more embodiments of the disclosure, an electronic device (e.g., the electronic device 300 of FIG. 3) may include: a first circuit board (e.g., the first circuit board 411 of FIG. 12) on which at least one double-sided disposing-type electronic component module (e.g., the double-sided disposing-type electronic component module 600 of FIG. 12) is disposed; at least one first connection member (e.g., the first connection member 413 of FIG. 12) disposed on the first circuit board; and a second circuit board (e.g., the second circuit board 412 of FIG. 12) stacked on the at least one first connection member. The at least one double-sided disposing-type electronic component module may include: a third circuit board (e.g., the third circuit board 610 of FIG. 12) facing the first circuit board; at least one first electronic component (e.g., the first electronic component 620 of FIG. 12) disposed on the third circuit board; a fourth circuit board (e.g., the fourth circuit board 630 of FIG. 12) facing the second circuit board; at least one second electronic component (e.g., the second electronic component 640 of FIG. 12) disposed on the fourth circuit board; a first contact point (e.g., the first contact point 625 of FIG. 12) disposed on one surface of the third circuit board and electrically connecting the first circuit board with the third circuit board; and a second contact point (e.g., the second contact point 645 of FIG. 12) disposed on one surface of the fourth circuit board and electrically connecting the second circuit board with the fourth circuit board.

According to one or more embodiments, the first connection member may be an interposer connector.

According to one or more embodiments, the electronic device may include a second connection member (e.g., the second connection member 660 of FIG. 12) connecting the third circuit board with the fourth circuit board.

According to one or more embodiments, the second connection member may be implemented as a CU pillar.

According to one or more embodiments, the second connection member may be implemented as solder bumps.

According to one or more embodiments, the electronic device may further include a molding portion (e.g., the molding portion 650 of FIG. 12) formed between the third circuit board and the fourth circuit board.

According to one or more embodiments, two second connection members may be formed on each of the third circuit board and the fourth circuit board to connect the third circuit board with the fourth circuit board, respectively, and a fifth circuit board (e.g., the fifth circuit board 770 of FIG. 10) may be interposed between the two second connection members.

According to one or more embodiments, the fifth circuit board may be stacked on a second connection member connecting the third circuit board with the fourth circuit board.

According to one or more embodiments, the electronic device may include a first antenna (e.g., the first antenna 450 of FIG. 13) connected to the first circuit board and a second antenna (e.g., the second antenna 460 of FIG. 12) connected to the second circuit board.

According to one or more embodiments, the at least one first electronic component may configure a first RFFE (e.g., the first RFFE 441 of FIG. 13) connected to the first antenna, and the at least one second electronic component may configure a second RFFE (e.g., the second RFFE 442 of FIG. 12) connected to the second antenna.

According to one or more embodiments, the first contact point and the second contact point may be formed as an SMD type and connected to the first circuit board and the second circuit board, respectively.

According to one or more embodiments of the disclosure, an electronic device (e.g., the electronic device 300 of FIG. 3) may include: a first circuit board (e.g., the first circuit board 411 of FIG. 12) including a first surface (e.g., the first surface 411a of FIG. 12) facing in a first direction (e.g., the +Z direction in FIG. 12) and a second surface (e.g., the second surface 411b of FIG. 12) facing a direction opposite to the first direction; at least one first connection member (e.g., the first connection member 413 of FIG. 12) disposed on the first surface of the first circuit board; a second circuit board (e.g., the second circuit board 412 of FIG. 12) including a third surface (e.g., 412a of FIG. 12) facing in the first direction and a fourth surface (e.g., 412b of FIG. 12) facing the direction opposite to the first direction, and stacked with the first circuit board to be connected to the first circuit board through the first connection member; and at least one double-sided disposing-type electronic component module (e.g., the double-sided disposing-type electronic component module 600 of FIG. 12) interposed between the first circuit board and the second circuit board. The double-sided disposing-type electronic component module may include: a third circuit board (e.g., the third circuit board 610 of FIG. 12) facing the first circuit board; at least one first electronic component (e.g., the first electronic component 620 of FIG. 12) disposed on one surface of the third circuit board; a fourth circuit board (e.g., the fourth circuit board 630 of FIG. 12) facing the second circuit board; at least one second electronic component (e.g., the second electronic component 640 of FIG. 12) disposed on one surface of the fourth circuit board; a first contact point (e.g., the first contact point 625 of FIG. 12) disposed on another surface of the third circuit board, surface-disposed on the first surface of the first circuit board, and electrically connecting the first circuit board with the third circuit board; a second contact point (e.g., the second contact point 645 of FIG. 12) disposed on (another surface of) the fourth circuit board, surface-disposed on the fourth surface of the second circuit board, and electrically connecting the second circuit board with the fourth circuit board; and a second connection member (e.g., the second connection member 660 of FIG. 12) connecting the third circuit board with the fourth circuit board. A molding portion (e.g., the molding portion 650 of FIG. 12) may be included in a space between the third circuit board and the fourth circuit board.

According to one or more embodiments, the first connection member may be an interposer connector.

According to one or more embodiments, the second connection member may be formed at edges of the third and fourth circuit boards.

According to one or more embodiments, the electronic device may further include a fifth circuit board interposed between the third circuit board and the fourth circuit board.

According to one or more embodiments, the fifth circuit board may be stacked on the second connection member connecting the third circuit board with the fourth circuit board.

According to one or more embodiments, the electronic device may include a first antenna connected to the first circuit board and a second antenna connected to the second circuit board.

According to one or more embodiments, the at least one first electronic component may configure a first RFFE connected to the first antenna, and the at least one second electronic component may configure a second RFFE connected to the second antenna.

According to one or more embodiments, the first contact point and the second contact point may be formed as an SMD type and connected to the first circuit board and the second circuit board, respectively.

According to one or more embodiments of the disclosure, a double-sided disposing-type electronic component module (e.g., the double-sided disposing-type electronic component module 600 of FIG. 12) disposed in an electronic device may include: a third circuit board (e.g., the third circuit board 610 of FIG. 12) facing a first circuit board (e.g., the first circuit board 411 of FIG. 12) of the electronic device; at least one first electronic component (e.g., the first electronic component 620 of FIG. 12) disposed on one surface of the third circuit board; a fourth circuit board (e.g., the fourth circuit board 630 of FIG. 12) facing a second circuit board of the electronic device; at least one second electronic component (e.g., the second electronic component 640 of FIG. 12) disposed on one surface of the fourth circuit board; a first contact point (e.g., the first contact point 625 of FIG. 12) disposed on another surface of the third circuit board, surface-disposed on a first surface of the first circuit board, and electrically connecting the first circuit board with the third circuit board; a second contact point (e.g., the second contact point 645 of FIG. 12) disposed on another surface of the fourth circuit board, surface-disposed on a fourth surface of the second circuit board, and electrically connecting the second circuit board with the fourth circuit board; a molding portion (e.g., the molding portion 650 of FIG. 12) formed in a space between the third circuit board and the fourth circuit board; and a connection member (e.g., the second connection member 660 of FIG. 12) connecting the third circuit board with the fourth circuit board.

According to one or more embodiments, the connection member may be implemented as a CU pillar.

According to one or more embodiments, the connection member may be implemented as solder bumps.

While certain embodiments of the disclosure have been described in the detailed description of the disclosure, it will be apparent to those skilled in the art that many modifications can be made without departing from the scope of the disclosure.

What is claimed is:

1. An electronic device comprising:
   a first circuit board including an upper surface being oriented in a first direction;
   at least one electronic component module disposed at the first circuit board;
   at least one first connection member disposed at the first circuit board;
   a second circuit board stacked on the at least one first connection member and including a lower surface being oriented in a direction opposite to the first direction;
   a first antenna connected to the first circuit board; and
   a second antenna connected to the second circuit board,
   wherein the at least one electronic component module comprises:
      a third circuit board disposed at the upper surface of the first circuit board and including an upper surface being oriented in the first direction;
      at least one first electronic component disposed at the upper surface of the third circuit board;
      a fourth circuit board disposed at the lower surface of the second circuit board and including a lower surface facing the upper surface of the third circuit board;
      at least one second electronic component disposed at the lower surface of the fourth circuit board;
      a first contact point disposed between the first circuit board and the third circuit board for electrically connecting the first circuit board with the third circuit board; and
      a second contact point disposed between the second circuit board and the fourth circuit board for electrically connecting the second circuit board with the fourth circuit board, and
   wherein the at least one first electronic component and the at least one second electronic component are spaced apart from each other in the first direction.

2. The electronic device of claim 1, wherein the at least one electronic component module is a double-sided disposing-type electronic component module.

3. The electronic device of claim 1, wherein the at least one first connection member is an interposer connector.

4. The electronic device of claim 1, further comprising a second connection member configured to connect the third circuit board with the fourth circuit board.

5. The electronic device of claim 1, further comprising a molding portion between the third circuit board and the fourth circuit board.

6. The electronic device of claim 1, further comprising a fifth circuit board interposed between the third circuit board and the fourth circuit board.

7. The electronic device of claim 1,
   wherein the at least one first electronic component is a first radio frequency front end (RFFE), and
   wherein the at least one second electronic component is a second RFFE.

8. The electronic device of claim 1, wherein each of the first contact point and the second contact point is a surface disposed device (SMD) type contact point.

9. The electronic device of claim 1, wherein the first circuit board, the second circuit board, the third circuit board, and the fourth circuit board are substantially parallel each other.

10. The electronic device of claim 4, wherein the second connection member is a copper pillar or solder bumps.

11. The electronic device of claim 6, further comprising two second connection members connecting the third circuit board with the fourth circuit board,
   wherein the two second connection members are provided on the upper surface of the third circuit board and the lower surface of the fourth circuit board, respectively, and
   wherein the fifth circuit board is interposed between the two second connection members.

12. The electronic device of claim 7, wherein the first RFFE is connected to the first antenna, and
   wherein the second RFFE is connected to the second antenna.

13. The electronic device of claim 8, wherein the first contact point and the second contact point are connected to the upper surface of the first circuit board and the lower surface of the second circuit board, respectively.

14. An electronic device comprising:
   a first circuit board including a first surface facing in a first direction and a second surface facing a direction opposite to the first direction;
   at least one first connection member disposed on the first surface of the first circuit board;
   a second circuit board including a third surface facing in the first direction and a fourth surface facing the direction opposite to the first direction, and stacked with the first circuit board to be connected to the first circuit board through the at least one first connection member;
at least one double-sided disposing-type electronic component module interposed between the first circuit board and the second circuit board;
a first antenna connected to the first circuit board; and
a second antenna connected to the second circuit board,
wherein the at least one double-sided disposing-type electronic component module includes:
a third circuit board facing the first circuit board;
at least one first electronic component disposed on a surface of the third circuit board;
a fourth circuit board facing the second circuit board;
at least one second electronic component spaced apart from the at least one first electronic component in the first direction and disposed on one surface of the fourth circuit board, which faces the surface of the third circuit board;
a first contact point disposed on another surface of the third circuit board, surface-disposed on the first surface of the first circuit board, and electrically connecting the first circuit board with the third circuit board;
a second contact point disposed on the fourth circuit board, surface-disposed on the fourth surface of the second circuit board, and electrically connecting the second circuit board with the fourth circuit board;
a second connection member connecting the third circuit board with the fourth circuit board, and
a molding portion is included in a space between the third circuit board and the fourth circuit board.

15. The electronic device of claim 14, wherein the at least one first connection member is an interposer connector.

16. The electronic device of claim 14, wherein the second connection member is formed at edges of the third and fourth circuit boards.

17. The electronic device of claim 14, wherein the electronic device further includes a fifth circuit board interposed between the third circuit board and the fourth circuit board.

18. An electronic device comprising:
a first circuit board;
a second circuit board;
a first antenna connected to the first circuit board;
a second antenna connected to the second circuit board; and
a double-sided disposing-type electronic component module comprising:
a third circuit board facing an upper surface of the first circuit board, the upper surface of the first circuit board being oriented to a first direction;
at least one first electronic component disposed on a surface of the third circuit board;
a fourth circuit board facing a lower surface of the second circuit board, the lower surface of the second circuit board being oriented to a direction opposite to the first direction;
at least one second electronic component spaced apart from the at least one first electronic component in the first direction and disposed on one surface of the fourth circuit board, which faces the surface of the third circuit board;
a first contact point disposed on another surface of the third circuit board, surface-disposed on the upper surface of the first circuit board, and electrically connecting the first circuit board with the third circuit board;
a second contact point disposed on another surface of the fourth circuit board, surface-disposed on the lower surface of the second circuit board, and electrically connecting the second circuit board with the fourth circuit board; and
a molding portion formed in a space between the third circuit board and the fourth circuit board; and a connection member connecting the third circuit board with the fourth circuit board.

19. The electronic device of claim 18, wherein the connection member is implemented as a CU pillar.

* * * * *